United States Patent
Bell (10) Patent No.: US 6,700,052 B2
(45) Date of Patent: Mar. 2, 2004

(54) FLEXIBLE THERMOELECTRIC CIRCUIT

(75) Inventor: Lon E. Bell, Altadena, CA (US)

(73) Assignee: Amerigon Incorporated, Irwindale, CA (US)

( * ) Notice: Subject to any disclaimer, the term of this patent is extended or adjusted under 35 U.S.C. 154(b) by 83 days.

(21) Appl. No.: 09/987,804

(22) Filed: Nov. 5, 2001

(65) Prior Publication Data

US 2003/0084935 A1 May 8, 2003

(51) Int. Cl.$^7$ .............................................. H01L 35/34
(52) U.S. Cl. ...................... 136/201; 136/203; 136/205; 136/211; 136/212
(58) Field of Search ............................... 136/203, 205, 136/208, 211, 212; 62/3.3, 3.4

(56) References Cited

U.S. PATENT DOCUMENTS

| | | | |
|---|---|---|---|
| 3,554,815 A | * 1/1971 | Osborn | 136/203 |
| 3,635,037 A | 1/1972 | Hubert | 62/3 |
| 3,681,929 A | 8/1972 | Schering | 62/3 |
| 3,779,814 A | 12/1973 | Miles et al. | 136/236 |
| 4,065,936 A | 1/1978 | Fenton et al. | 62/3 |
| 4,730,459 A | 3/1988 | Schlicklin et al. | 62/3 |
| 5,092,129 A | 3/1992 | Bayes et al. | 62/3.3 |
| 5,228,923 A | 7/1993 | Hed | 136/208 |
| 5,232,516 A | 8/1993 | Hed | 136/204 |
| 5,802,856 A | 9/1998 | Schaper et al. | 62/3.7 |
| 6,084,172 A | 7/2000 | Kishi et al. | 136/200 |
| 6,097,088 A | * 8/2000 | Sakuragi | 257/712 |
| 6,334,311 B1 | 1/2002 | Kim et al. | 62/3.2 |
| 6,346,668 B1 | 2/2002 | McGrew | 136/200 |
| 6,347,521 B1 | 2/2002 | Kadotani et al. | 62/3.7 |
| 6,410,971 B1 | * 6/2002 | Otey | 257/467 |

FOREIGN PATENT DOCUMENTS

WO    WO 02/13282    * 2/2002

OTHER PUBLICATIONS

A New Concept of Porous Thermoelectric Module Using a Reciprocating Flow for Cooling/Heating System (Numerical Analysis for Heating System), Shigeru Tada, Ryozo Echigo and Hideo Yoshida, 16$^{th}$ International Conference on Thermoelectrics (1997).
International Search Report for PCT/US 02/03654 dated Jun. 12, 2002.
H. J. Goldsmid, *Electronic Refrigeration*, Pion Ltd, 207 Brondesbury Park, London (1986).
Stanley W. Angrist, *Direct Energy Conversion*, 32 Ed. Ally & Bacon (1976).
International Search Report for PCT/US 02/06285 dated Jun. 12, 2002.
A New Concept for Improving Thermoelectric Heat Pump Efficiency, R.J. Buist, J.W. Fenton and J.S. Lee, Borg-Warner Thermoelectrics Wolf and Algonquin Road.

* cited by examiner

Primary Examiner—Patrick Ryan
Assistant Examiner—Thomas H. Parsons
(74) Attorney, Agent, or Firm—Knobbe, Martens, Olson & Bear, LLP (57) ABSTRACT

A flexible thermoelectric circuit is disclosed. Thermoelectric circuits have traditionally been of the rigid or substantially rigid form. Several different embodiments of thermoelectric circuits are disclosed which permit flexion in one or more directions to permit applications where flexible thermoelectric circuits are advantageous.

57 Claims, 7 Drawing Sheets

FLEXIBLE THERMOELECTRIC CIRCUIT

BACKGROUND OF THE INVENTION

1. Field of the Invention

The description below relates to flexible thermoelectric circuits.

2. Description of the Related Art

Present Thermoelectric Modules (TEMs) use substrates to form the electrical paths to connect individual Thermoelectric Elements (TEEs). Generally, the connections are made so that one surface of an array of TEEs is heated and the opposite surface is cooled when current is passed through the array in a specified direction. Most TEMs have ceramic substrates with copper circuits to connect individual TEEs. The TEEs are soldered to the copper circuits. Other systems use printed and fired conductive ink circuits, and still others use circuits fabricated within the substrate structure itself and have the circuit pattern formed into a monolithic substrate/conductor structure.

In certain TEMs, Kapton or other high temperature organic substrates are used in combination with laminated or deposited copper circuit material. Such assemblies are processed using printed circuit technology to form the circuit pattern and electrically connect the TEEs. The substrate construction produces TEMs that are essentially rigid.

In TEM designs the substrates are on opposite sides of the TEEs forming a sandwich with the TEEs between the substrates. Because of this geometry, present substrates, even those that are polymer based, do not allow the TEM to flex to the degree needed. Furthermore, when such assemblies are bent forcefully, high shear forces are produced on individual TEEs which cause immediate failure or reduced life. In applications that involve exposure to thermal cycling, variable mechanical loadings, shock or vibration, bending and shear forces can occur repeatedly so the systems tend to have short life and can thereby make the use of TEMS impractical

SUMMARY OF THE INVENTION

Certain recent applications for TEMs benefit from the use of flexible TEMs that can be shaped to meet the geometrical constraints imposed by the optimized cooling and heating system performance. By employing such flexible TE systems, costs, size and complexity can be reduced and system capability improved.

Substrates are designed and constructed so that they can flex in one or more directions; the construction of such substrates follows certain design guidelines that are described in text and figures that follow. Several variations are described that can meet specific design needs such as (1) flexure in one and more than one direction; (2) designs for TEMs that flex and have zones that heat and others that cool on the same substrate surface; (3) systems that provide thermal isolation in accordance with co-pending U.S. patent application Ser. No. 09/844,818 entitled Improved Efficiency Thermoelectrics Utilizing Thermal Isolation; and (4) systems that are cascades or multi-layered.

Several embodiments and examples of thermoelectrics are described. A first embodiment involves a flexible thermoelectric that has a plurality of thermoelectric elements and first and second substrates. The substrates sandwich the plurality of thermoelectric elements and have electrical conductors that interconnect ones of the plurality of thermoelectric elements. At least one of the first and second substrates is constructed of a substantially rigid material, and the substrates are configured to flex in at least one direction.

For example, at least one substrate may be weakened, have cuts, be formed in sections, be shaped, be constructed of a material, or be modified in order to permit flexing. The flexible thermoelectric, in one embodiment, is for use with a fluid flow, and the sections or cuts are formed in a manner to improve thermal isolation from section to section in at least the direction of fluid flow. Other features may be provided to provide thermal isolation in the direction of fluid flow.

In one embodiment, the thermoelectric flexes in at least two directions. In another embodiment, the thermoelectric is constructed with a single layer of thermoelectric elements, and cools on a first side and heats on a second side, in response to an electrical current. Alternatively, or in addition, at least portions of the thermoelectric may have multiple layers of thermoelectric elements. In this manner, a first plurality of thermoelectric elements may be positioned along a first side of a central substrate and a second plurality of thermoelectric elements may be positioned along an opposing side of the central substrate. The first plurality of thermoelectric elements are sandwiched between the first substrate and the central substrate, and the second plurality of thermoelectric elements are sandwiched between said second substrate and the central substrate. In this embodiment, the flexible thermoelectric may be configured to provide both heating and cooling on one side of the thermoelectric, in response to a current flow.

In one embodiment, the flexible thermoelectric further has at least a first thermal conductor configured to provide heat flow to and/or from the thermoelectric. In addition, the thermal conductor strengthens the thermoelectric.

Another example of a flexible thermoelectric has a plurality of thermoelectric elements, and first and second substrates sandwiching the plurality of thermoelectric elements, wherein at least one of the first and second substrates is constructed in sections in a manner to permit flex of the thermoelectric in at least one direction.

At least one of the substrates may be weakened, formed in sections, have cuts, be of a material selected, or be shaped, to permit flexing. As with the previous embodiment, the flexible thermoelectric may be for use with a fluid flow, and the cuts may be formed in a manner to improve thermal isolation from section to section in at least the direction of fluid flow. In one advantageous embodiment, the flexible thermoelectric flexes in at least two directions.

Again, the flexible thermoelectric may also be constructed with a single layer of thermoelectric elements, or multiple layers of thermoelectric elements. The flexible thermoelectric may be configured to cool on a first side and heat on a second side, or to both cool and heat on the same side. For example, a first plurality of thermoelectric elements may be positioned along a first side of a central substrate and a second plurality of thermoelectric elements may be positioned along an opposing side of the central substrate, where the first plurality of thermoelectric elements are sandwiched between the first substrate and the central substrate, and the second plurality of thermoelectric elements are sandwiched between said second substrate and the central substrate. A thermal conductor may be provided for heat flow to and/or from the thermoelectric. In addition, a thermal conductor may be used to strengthen the thermoelectric.

In another embodiment, a flexible thermoelectric has a plurality of thermoelectric elements, and first and second substrates sandwiching the plurality of thermoelectric elements. In this embodiment, preferably, at least one of the first and second substrates is constructed in a non-uniform manner to permit flex of the thermoelectric in at least one direction. For example, at least one substrate is weakened in places, is formed in sections, has cuts in a plurality of locations, is shaped non-uniformly, or is formed of a material in certain locations in order to permit flexing. Where the thermoelectric is for use with a fluid flow, the cuts or sections or non-uniformities are preferably formed in a manner to improve thermal isolation in at least the direction of fluid flow. In one embodiment, the thermoelectric flexes in at least two directions.

The thermoelectric may be constructed with a single layer of thermoelectric elements, or with multiple layers of thermoelectrics. In this manner, the thermoelectric may be configured to cool on a first side and heat on a second side, and/or provide both heating and cooling on the same side. For example, a first plurality of thermoelectric elements may be positioned along a first side of a central substrate and a second plurality of thermoelectric elements may be positioned along an opposing side of the central substrate, the first plurality of thermoelectric elements sandwiched between the first substrate and the central substrate, and the second plurality of thermoelectric elements sandwiched between said second substrate and the central substrate.

A method of constructing a flexible thermoelectric is also disclosed, involving the steps of providing a plurality of thermoelectric elements, and positioning or forming the thermoelectric elements between first and second substrates, wherein at least one of the substrates is constructed of a substantially rigid material, and configured to permit flexing of the thermoelectric.

In accordance with the method, the substrates may be formed in sections, may be weakened in locations, may have cuts, may be shaped, and/or may be formed of material selected to permit flexing in one or more directions. Where the resulting thermoelectric is for use with a fluid flow, the method involves making the thermoelectric in a manner to improve thermal isolation in at least the direction of fluid flow.

The method may involve forming a single layer of thermoelectric elements, or multiple layers of thermoelectric elements. In this manner, the thermoelectric may be configured to provide heating on one side and cooling on another, and/or both heating and cooling on the same side.

DETAILED DESCRIPTION OF THE PREFERRED EMBODIMENT

Figure 1A:
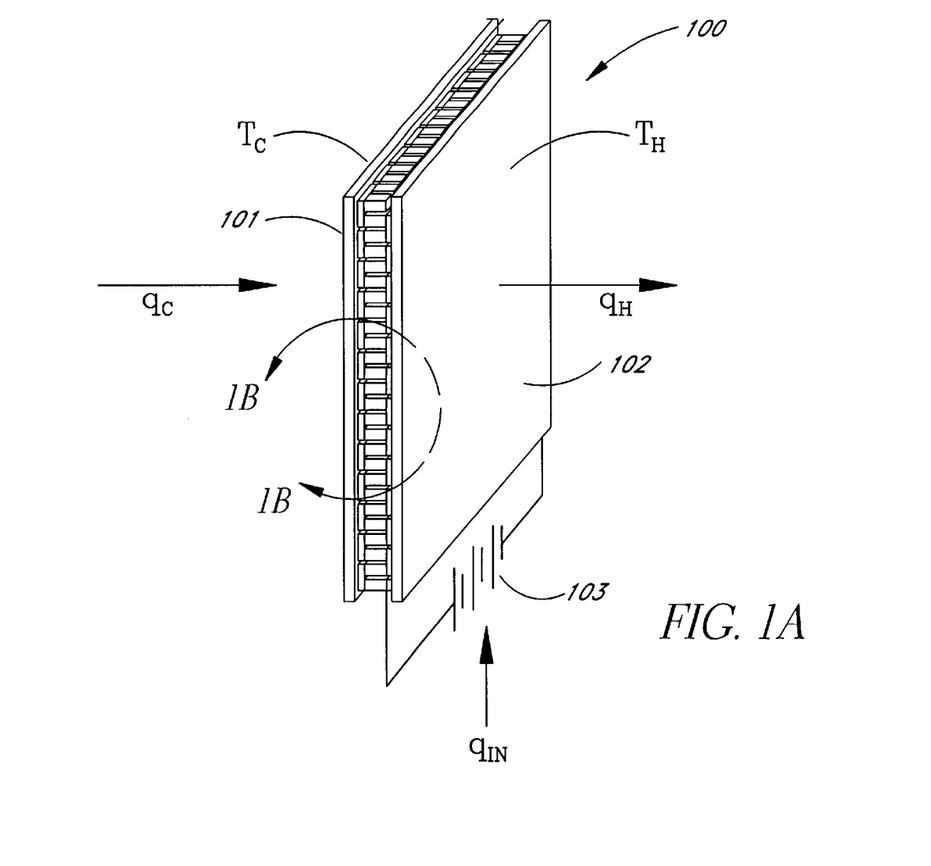
FIG. 1 depicts a conventional TEM with a ceramic substrate.
Figure 1B:
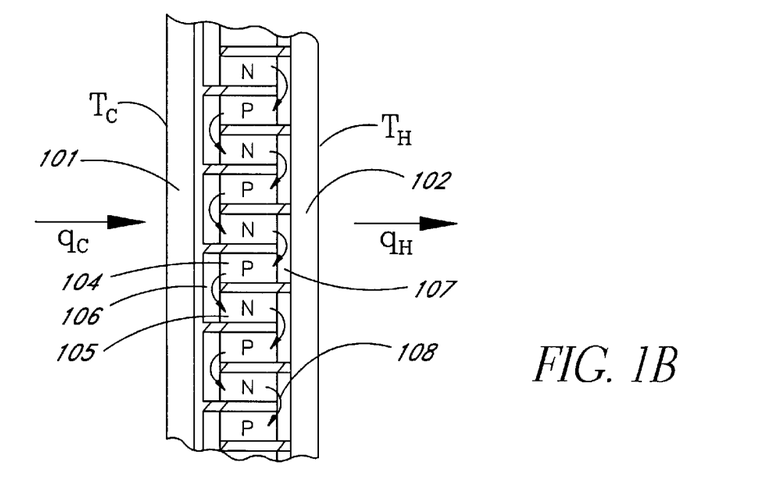

FIG. 1A depicts a conventional TEM 100 with substantially rigid first and second substrates 101, 102. Power supply 103 provides current to the TEM 100. FIG. 1B depicts details of the TEM's 100 internal circuitry. P-type 104 and N-type 105 TEEs alternate and are electrically connected in series through circuits 106 and 107. The circuits 106 and 107 are attached to the substrates 101 and 102, respectively.

When the TEM 100 is connected to the power supply 103, the electrons flow in the direction indicated by arrows 108. All of the electrons flow from P-type TEEs 104 to a circuit 106 to N-type TEEs 105 on the first substrate 101 side. On the second substrate 102 side, exactly the opposite occurs. Electrons always flow from the N-type TEEs 105 through circuits 107 to P-type TEEs 104. Under these circumstances, the flow of heat is shown by the arrows, with $q_c$ indicating cooling at substrate 101 and $q_h$ indicating heating at substrate 102. The power in is denoted by $q_{in}$. $T_c$ indicates the temperature of the first substrate 101, and $T_h$ indicates the temperature of the second substrate 102.

Figure 2A:
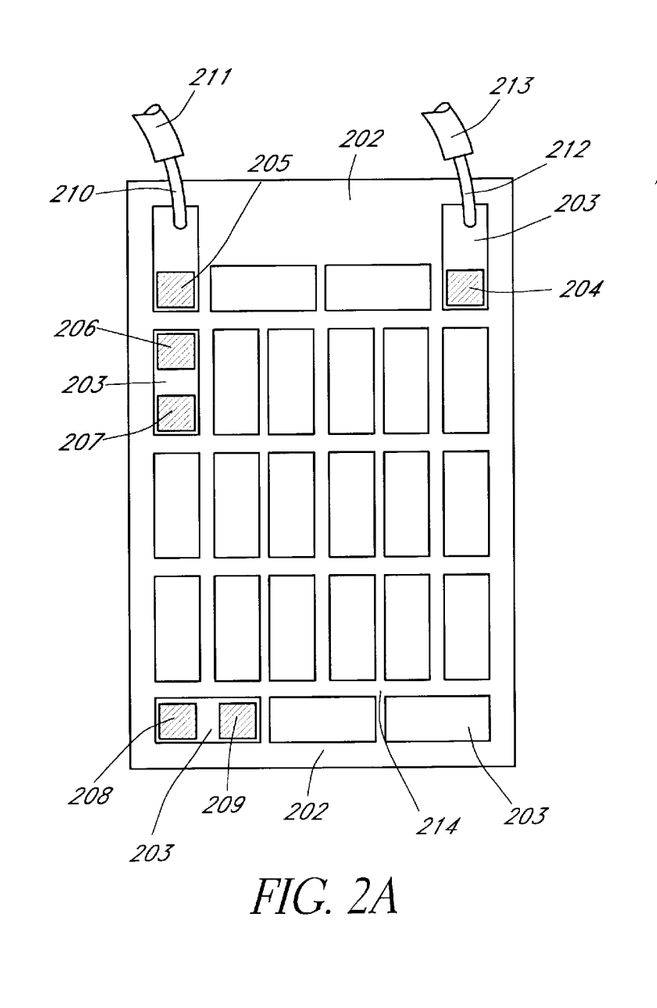
FIG. 2 depicts a typical circuit pattern for a conventional TEM.
Figure 2B:
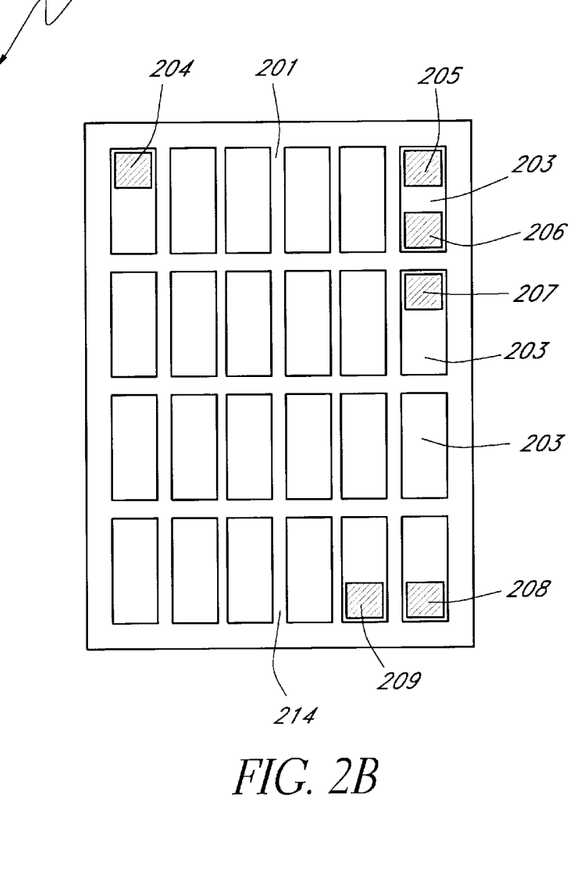

FIG. 2 depicts in more detail a typical circuit pattern for the principal components of the TEM of FIG. 1. A first upper substrate 201 consists of a series of electrically conductive circuits 203 to which are soldered or otherwise uniformly and electrically connected TEEs 204, 205, 206, 207, 208 and 209. In this configuration, every circuit 203 has two TEEs, one N-type and one P-type, attached. A corresponding second or lower substrate 202 has electrically conductive circuits 203 attached. The lower substrate 202 also has two electrical wires 210 and 212 electrically attached to two of the circuits 203, the wires 210 and 212 are shown sheathed in insulation 211 and 213, respectively.

When assembled, the upper substrate 201 is positioned with respect to the lower substrate 202 so that the two ends of the TEE 204 engage circuits 203. Similarly, TEEs 205, 206, 207, 208 and 209 ends are engaged as shown. Current enters through the wire 210 and passes upward from the lower substrate 202 to the upper substrate 203 through the TEE 205. It then passes along the circuit 203 to the TEE 206, and so on, as was illustrated in FIG. 1. This pattern continues through TEE 208 where the circuit 203 connects to TEE 209 on the lower substrate 202. The current passes through 209 to the upper substrate 201, and along the second set of circuits 203 which are interconnected through TEEs (not shown). The current continues to pass through circuits 203 and TEEs until it reaches TEE 204 and circuit 203. From there the current exits the TEM through wire 212.

Current is directed along the desired paths by electrically isolating the separate circuits 203 by electrically insulative areas 214.

Generally, it is desirable that the upper and lower substrates 201 and 202 are constructed of electrical nonconductive materials such as alumina ceramic or the like. Preferably, the substrate materials have as high a thermal conductivity as possible perpendicular to the plane of FIG. 2 so that heat can be transported through the substrates to the outer faces of the assembled TEM with as little temperature change as possible. The circuit material and the circuit 203 design should maximize electrical conductivity between adjacent TEEs. This combination of design and material properties held minimize thermal and electrical losses in the TEM.

Figure 3A:
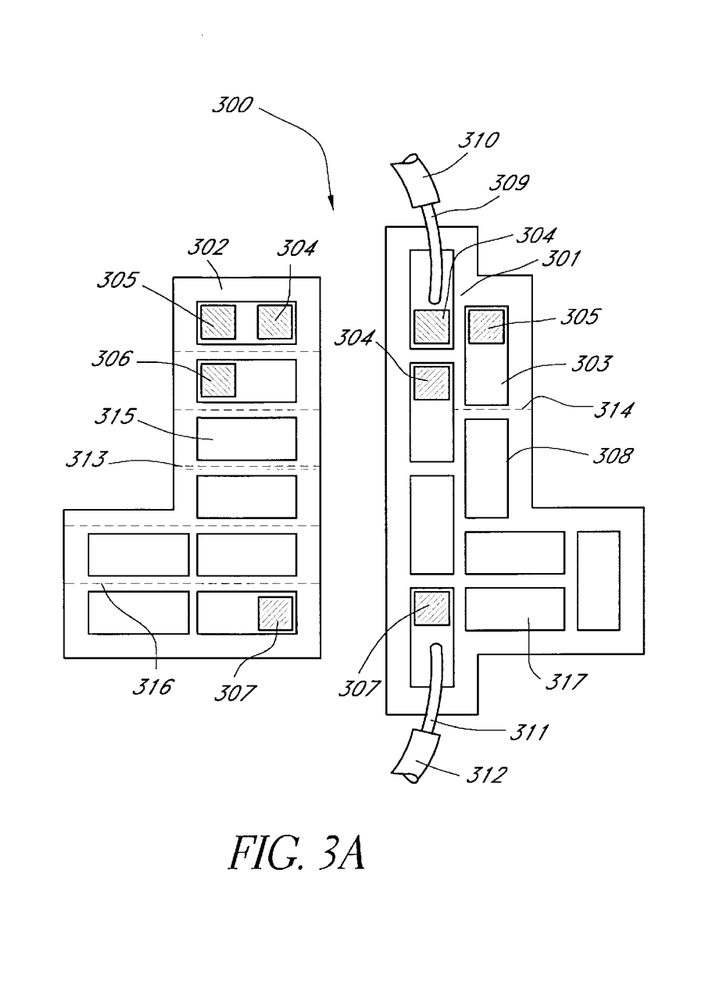
FIG. 3 depicts a substrate for flexible TEMs.

FIG. 3A depicts an example of a substrate system 300 wherein at least one of the substrates is constructed of a substantially rigid material in one preferred embodiment. The upper substrate 301 is made from a high thermal conductivity flexible material preferably such as Kapton polyamide film, very thin fiberglass, or any other flexible material. Circuits 303 are on the upper substrate in a pattern. Similarly, a lower substrate 302, which is preferably, but not necessarily, of a substantially rigid material, has circuits 315 arranged in a pattern on it. TEEs 304, 305, 306 and 307 are some of the TEEs in the TEM. Wires 309 and 311 each attach to a circuit. Insulation 310 and 312 sheathe the wire.

The upper circuit 301 is connected to the lower circuit 302 so that the respective ends of the TEEs 304, 305, 306 and 307 mate at the positions indicated in FIG. 3A. The TEEs are of N-type and P-type and are arrayed with the circuits 303 and 315 so that current flows alternately through each type of material. The pattern is such that current flows from one wire 309 through the TEM 300 to the other wire 311, as was described in detail in FIG. 2.

Preferably, after assembly of the TEM, slots are cut into the lower substrate at positions 313 so as to separate the lower substrate 302 into segments. The upper substrate 301 can flex in the areas 308 if the circuits 303 can flex so as to not degrade the TEE circuit 303 electrical connection. By separating the substrate 302 at several locations, the TEM can be flexed in a concave direction with respect to the outer surface of the TEM upper substrate 301. Furthermore, if a cut 314 is made in the upper substrate 301 at several locations, and the cuts 316 are made in the lower substrate 302, the TEM can be twisted about its length as well as bent. In addition, if slots are made in the lower substrate 302 so as to remove material as shown at 313, the TEM can flex in both directions.

The general description of FIG. 3A holds for an even number of TEEs in a horizontal row. For larger number of TEEs, there will be one circuit 315 for every two TEEs added in each row of the lower substrate 302. One circuit 317 is added for each circuit 315 added.

Figure 3B:
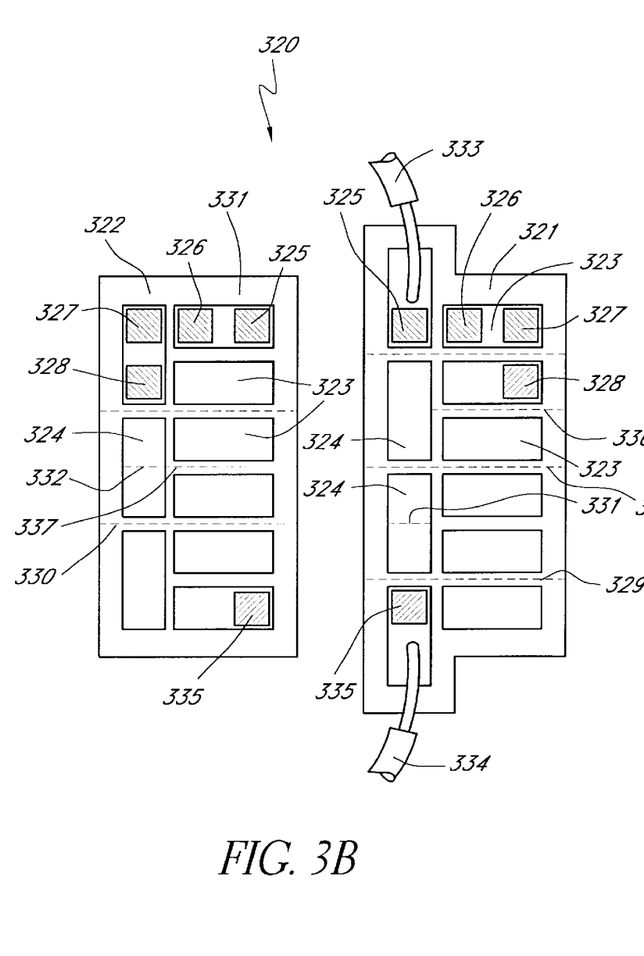

FIG. 3B depicts a configuration 320 with an odd number of TEEs (for example, 325, 326 and 327) in each horizontal row. For the geometry, both the upper substrate 321 and the lower substrate 322 have both horizontal and vertical circuits 323 and 324. As in FIG. 2, the assembly consists of N and P-type TEEs, and circuits arranged as described therein. Wire assemblies 333 and 334 are attached at the ends. Cuts 329 and 330 are made respectively in the upper substrate 321 and the lower substrate 322 at the locations shown.

When the TEM is assembled, for example, current enters through wire assembly 333 and into TEE 325 and so on until it exits at the wire assembly 324, after passing through the TEE 335. Again, the TEEs are alternately P and N-types so that as current passes, one side is heated and the other cooled. The cuts 329 and 330 allow the assembled TEM to flex in two directions if the circuits 323 and 324 can flex or bend at 331 and 332. If the cuts 329 and 330 are formed as slots with the removal of substrate material, the corresponding flexure points can bend in both directions. Finally, if cuts 336 and 337 are incorporated, the assembled TEM can twist about its length.

In FIGS. 3A and 3B TEMs 300 and 320 form separate arrays. As a part of the present invention, part of a TEM can be of one type and other parts of the other type.

Figure 4:
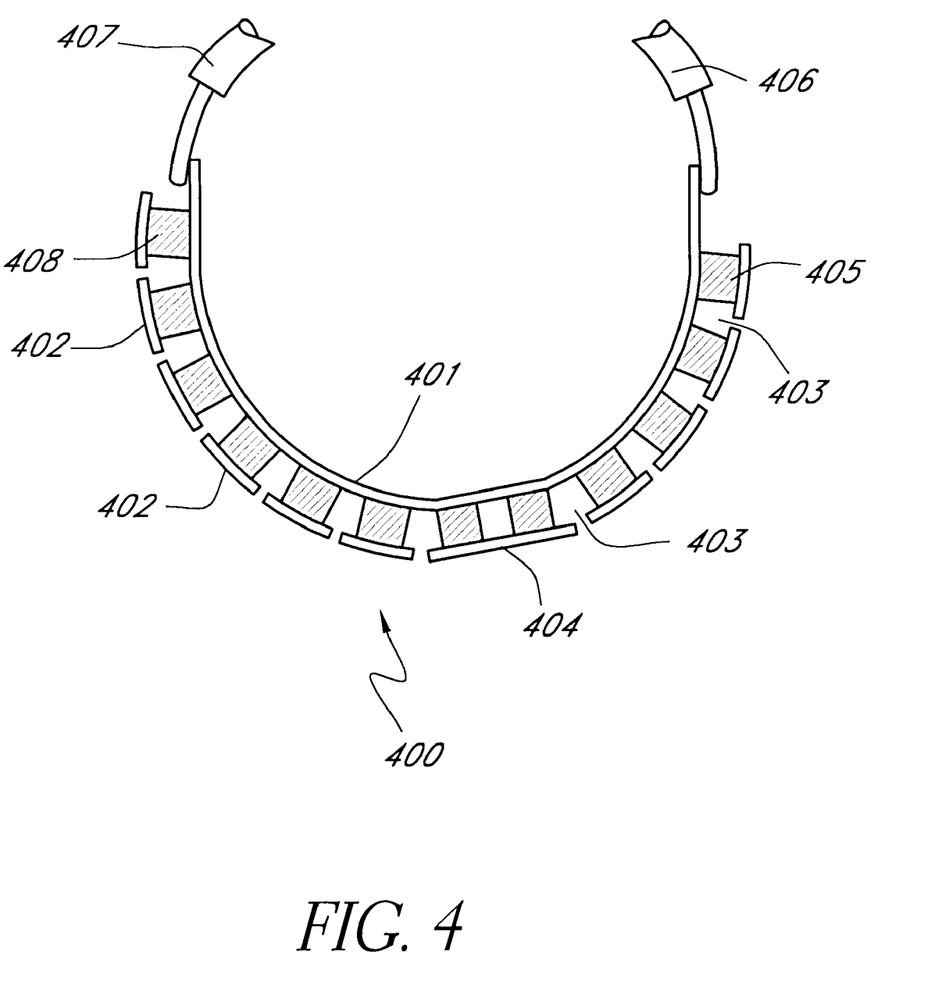
FIG. 4 depicts a TEM flexible in one direction.

FIG. 4 depicts a TEM 400 with an upper substrate 401 and cut lower substrate 402. Again, in this embodiment, the lower substrate material is substantially rigid, but is modified or configured in a manner to be flexible. In this configuration, dividing the substrate into sections permits the flexibility. Wire assemblies 406 and 407 are attached at each end. In accordance with the geometry of FIG. 3A, each row has an even number of TEEs 405 and 408. The TEEs are connected via circuits (not shown) as in FIG. 3A. The circuits, in practice, generally are very thin, such as printed circuit traces. Therefore, the circuits are often not shown in the Figures herein, except to illustrate the manner in which the circuits connect the individual TEEs.

The TEM has been bent in the principal direction indicated in the description of FIG. 3A. Spaces 403 develop because of the flexure. For descriptive purposes, the lower substrate 402 has not been cut at location 404 and therefore, that segment does not have a bend to it.

Figure 5:
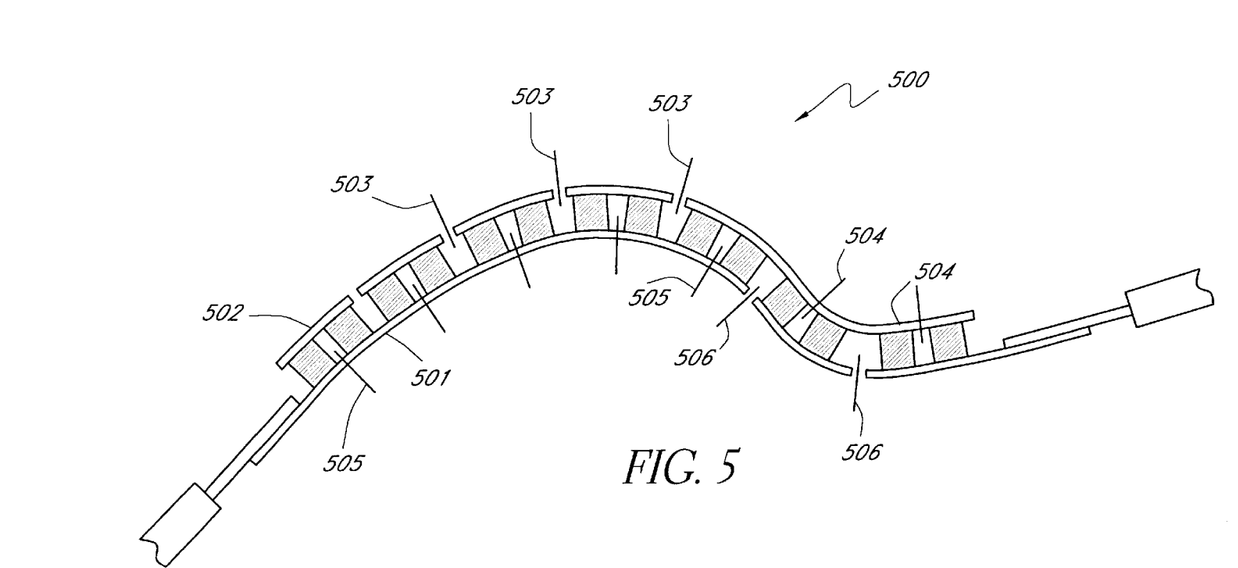
FIG. 5 depicts a TEM flexible in two directions.

FIG. 5 depicts a TEM 500 formed according to FIG. 3B. It consists of a lower substrate 501, preferably but not necessarily constructed from substantially rigid material with cuts 505 and 506 to permit flexing and an upper substrate 502 with cuts 503 and 504. TEEs and electrical paths are connected as discussed in FIGS. 2 and 3B.

The TEM 500 is shown flexed in two directions. The cuts 503 are spread open and form gaps in the upper substrate 502 where TEM 500 is flexed in one direction while other cuts 504 are not open where TEM 500 is flexed in the opposite direction. Similarly, in lower substrate 501, cuts 505 are closed while cuts 506 are open.

As noted in the discussion of FIGS. 3A and 3B, where material is removed (as an example, regions at slots 504 and 505) such locations contribute to flexure since the substrates 501 and 502 are able to flex at those locations as well.

Figure 6:
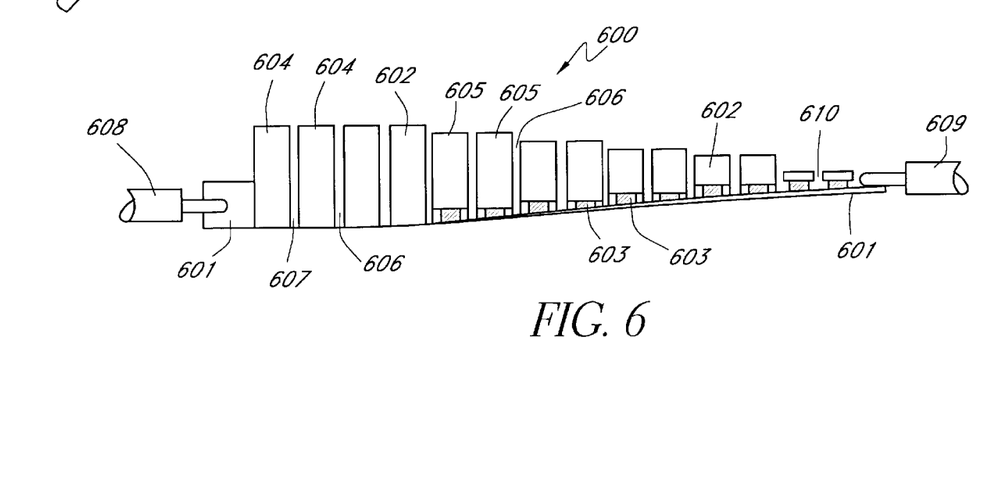
FIG. 6 depicts a TEM flexible in multiple directions.

FIG. 6 depicts a TEM 600 of the type described in FIG. 3A. Wire assemblies 608 and 609 are attached to the lower substrate 601. Upper substrate 602 and TEEs 603 are connected with circuits (not shown) as discussed in FIG. 3A. Slots 606 are in the upper substrate 602. Opposite the slots 606 are partial cuts not visible in FIG. 6, but of the type shown as slot 314 of the upper substrate 301 in FIG. 3A.

The TEM 600 is depicted as twisted about its length so that the upper substrate 602 is vertical at location 607 and horizontal at the opposite end 610. The two adjacent circuits at 604 and the two adjacent circuits at 605 act as rigid units since there is no twist in the TEM 600 at these points. Twisting occurs at slots 606 in the upper substrate 602 and the partial slots (not shown) at the corresponding location in lower substrate 601. TEEs 603 are connected via a circuit (not shown) that is adjacent to a partial slot in the lower substrate 601. Current can pass through the TEM 600 via wire assemblies 608 and 609.

Figure 7:
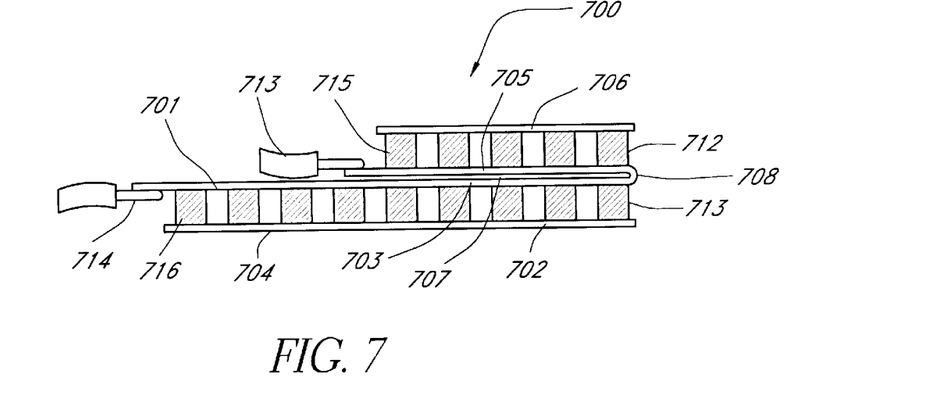
FIG. 7 depicts a flexible TEM with heating and cooling in separate zones of the same substrate.

FIG. 7 depicts a TEM 700 with the upper substrate 701, 703 and 705 and a lower substrate 702, 704 and 706, circuits (not shown), and TEEs 712, 713, 715 and 716. The upper substrate 701 is folded upon itself at fold 708. Grease 707, solder or other high thermal conductivity material fills the space between the two segments of the upper substrate 703 and 705. A circuit as described in FIG. 2 (not shown), connects TEE 712 to TEE 713. The circuit pattern is either that of FIG. 3A or 3B. At the fold 708, the TEEs 712 and 713 are both of the same type. All other TEEs are alternately N-type and P-type and are connected as described in FIG. 2.

As an example, during operation, current enters at wire assembly 713 and passes through an N-type TEE 715 and on through the first of the TEM 700 and exits through TEE 716 at wire assembly 714. With this as an example, the lower substrate surface 706 is cooled and the upper substrate surface 705 is heated. The heat generated is conducted to the upper substrate surface 703 by the grease 707. Since the two connecting TEEs 712 and 713 are of the same type and all others are electrically connected in series and of alternating type, the upper substrate surfaces 701 and 703 are cooled and the lower substrate surfaces 702 and 704 are heated. The upper substrate surface 703 removes the heat generated at the upper substrate surface 705 and cools that surface, so that the lower substrate surface 706 is significantly colder than the portion of the upper substrate surface 701, not contact with substrate surface 705. Thus, a typical TEM cascade is formed in the region of the contact zone 707, and a single stage TEM is formed elsewhere. With this geometry, design of the TEEs in the regions between substrate surfaces 705 and 706 and also between 702 and 703, can be of a form well known to the art.

It is clear that other levels could be added to the cascade region of TEM 700, and that multiple separate cascades could be fabricated by one or more flexible TEMs employing the above concepts and simple extensions thereof.

Figure 8:
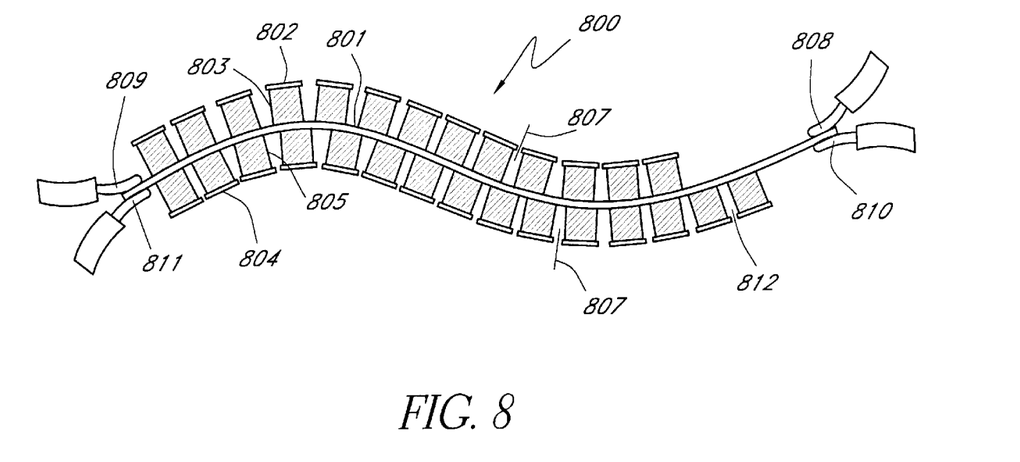
FIG. 8 depicts a multi-layer flexible substrate.

FIG. 8 depicts another variation of a TEM 800. Herein, a backbone substrate 801 has circuits on each side preferably of the type of upper substrate 301 of FIG. 3A. The TEM 800 has two additional substrates, an upper substrate 802 and a lower substrate 804. Each has slots 807 formed by removing substrate material. Between the upper substrate 802 and the backbone substrate 801 are TEEs 803 and between the backbone substrate 801 and the lower substrate 804 are TEEs 805. The TEEs 803 and 805 are alternately N-type and P-type and are connected by circuits, as in FIG. 3A (not shown). In this example, the components are electrically connected so that the portion above the insulation layer in the backbone substrate 301 forms one TEM circuit with wire connections 808 and 809 and the portion below forms a separate TEM circuit with wire connections 810 and 811.

The TEM 800 operates by passing current from, for example, 808 to 809 and a separate current from 810 to 811. In this example, the current flows so that the upper substrate 802 is cooled and hence the upper surface of the backbone substrate 801 is heated. Heat passes through to the lower surface of the backbone substrate 801, which is the cooled side of the lower portion. The lower substrate 804 is therefore heated. Thus, in this example, the TEM 800 is a cascade system. Alternately, the backbone substrate 801 could be wider, thermal energy transferred through the added width, and the currents could flow so that the backbone substrate 801 was heated or cooled by both the upper and lower TEMs.

Currents, TEE materials, number of TEEs and TEE dimensions can differ anywhere within the TEM 800 to achieve specific design and performance objectives. Also, the upper substrate 802 and the lower substrate 804 need not be the same dimensions or exact shape, thus, for example, a portion 812 of the lower substrate 804 need not have a corresponding part of the upper substrate 802, directly in thermal contact with it. As additional examples, the upper substrate 802 could be of the type shown in FIG. 3B and the lower substrate 804 of the type shown in FIG. 3A. Or, the upper substrate 302 could have fewer TEEs in each row compared to the lower substrate 804 and the total number of TEEs could differ among rows. Also, the electrical connections could be modified to pass current from the upper circuits of TEM 800 to the lower circuits so that two of the wires, for example, 809 and 811, would be eliminated. Other connection changes could be made to modify performance at certain locations, or to achieve other purposes.

The flexible TEMs described herein will often have improved thermal isolation as explained in co-pending U.S. patent application Ser. No. 09/844,818 entitled Improved Efficiency Thermoelectrics Utilizing Thermal Isolation, filed Apr. 27, 2001. As explained in that application, when the thermoelectric is utilized for heating or cooling of a flowing fluid, thermal isolation in the direction of flow improves the efficiency of the thermoelectric. Therefore, as an example, the cuts in FIGS. 4, 5 and 8, or sections of substrates may be made to correspond, where practical, to provide improved thermal isolation between sections separated by the cuts, in order to improve overall efficiency of the flexible thermoelectric.

Figure 9A:
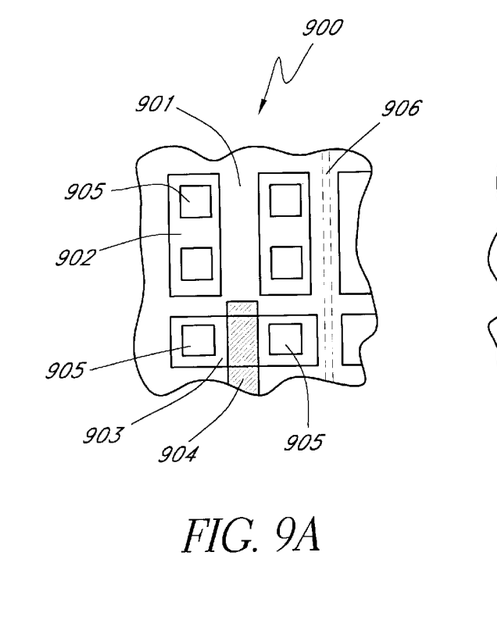
FIG. 9 depicts representative patterns for flexible conductors in a flexible TEM.

FIG. 9 depicts a portion of a substrate 900 that consists of flexible substrate material 901, circuits 902 and 903, solder mask 904, TEEs 905 and slot 906. In this design, the assembly incorporates substrate 900 to mechanically connect parts.

The circuit 902 is of the form previously discussed in FIGS. 3A and 3B. Circuit 903 depicts a method for allowing that circuit to flex in the region between TEEs 905. In this configuration, solder mask 904 covers a portion of the circuit 903 so as to prevent solder from accumulating where it is so covered. If the substrate 901 is flexed, bending will occur preferentially in the solder mask 904 region, since the circuit 903 does not have solder build up there and hence, is thinnest and most easily flexed there. Such preferential bending reduces mechanical stress at the interface of the TEE 905 and circuit 903.

Figure 9B:
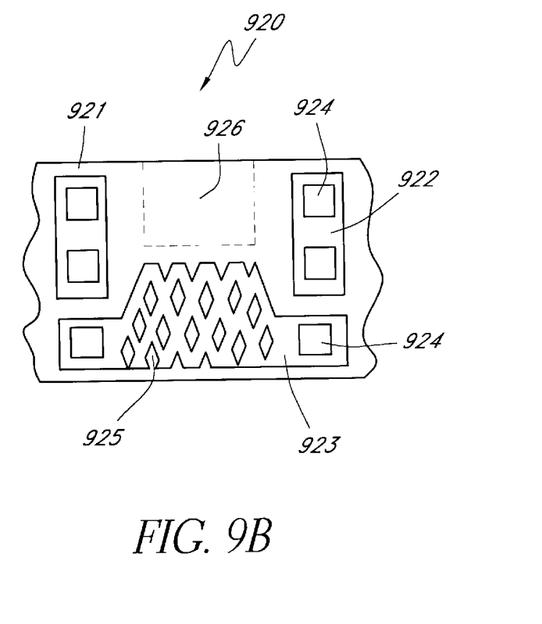

FIG. 9B depicts another geometry 920 which achieves flexure. Flexible substrate material 921 has circuits 922 and 923 attached, TEEs 924 and an elongated slot 926. Sections 925 of the circuit 923 have been omitted.

The geometry 920 is known to the flexible circuit industry as a design that allows severe or repeated flexure with good stability. Further, by proper design, known to the art, solder accumulation in the flexure can be either prevented or reduced to acceptable levels and shear stresses induced during flexure (at the circuit 923 and substrate 921 interface) can be reduced.

Other designs for electrically conductive flexures, such as circuits that incorporate components not attached to the substrate (e.g., shunt wires and strips, electrically conductive hinges, and the like) can be employed to allow needed movement and are the subject of this invention.

Figure 10:
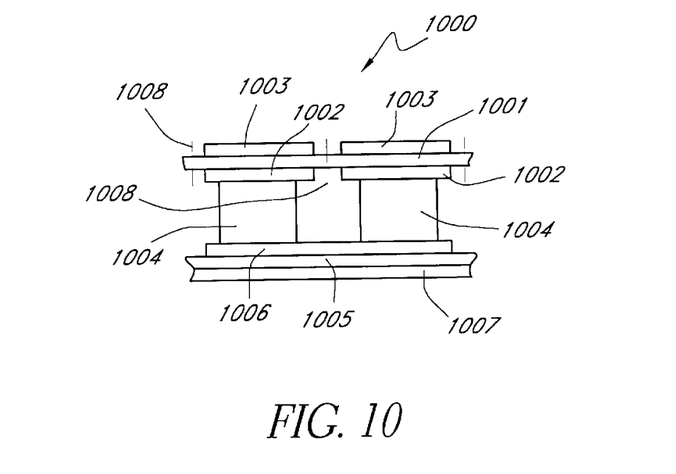
FIG. 10 depicts a TEM with enhanced heat transfer produced by secondary thermally conductive members.

FIG. 10 depicts a portion 1000 of a TEM of the present invention. It consists of an upper substrate 1001 with circuits 1002 and upper thermal conductors 1003 attached. A lower substrate 1005 has circuit 1006 and thermal conductor 1007 attached. TEEs 1004 are electrically connected to the circuits. Slots or cuts 1008 are in the upper substrate 1001 to allow flexure.

The thermal conductors 1003 and 1007 are designed to increase and distribute heat flow to and from the TEM. The conductors 1003 and 1007 are useful in high-power TEMs since typical substrate materials have relatively low thermal conductivity, and thereby reduce TEM performance. Performance can be improved by utilizing thermal conductors to increase thermal energy transport across the substrate and also mechanically strengthen the TEM. These improvements can be done by (1) maximizing the surface area of the circuit substrate and thermal conductor interface, (2) minimizing thermal resistance across the interfaces by selecting materials or material composites that minimize interfacial thermal resistance, or (3) utilizing the thermal conductors as structural members so that the substrate can be thinner, weaker or otherwise allow selection from a broader class of electrical insulators. These provide examples of designs that achieve enhanced performance, cost reduction, improved durability, size reduction and other benefits by utilizing additional componentry with the substrate. The above are presented as examples, and they do not cover all variations or otherwise restrict the scope of the invention.

In the discussion of FIGS. 3 through 10, it was stated that the substrate could have cuts, slots and sections removed to achieve flexure and bending. The same effect can be achieved by utilizing substrates that are mechanically weak. For example, the substrate could be made of a soft or weak material such as Teflon TFE, a silicone rubber, or the like; it could be made very thin; it could be mechanically weakened by incorporating holes, porosity, and making it from felt or the like; could be chemically weakened, treated to have its flexibility increased in selected areas, etched or the like; it could be fabricated with areas weakened, omitted, treated or otherwise modified, made thinner, slotted or the like that frees adjacent TEEs to move toward or away from one another so as to allow flexure and/or twisting within the TEM. The substrate could be completely omitted from the TEM so that unconstrained circuits would connect TEEs. Upon installation (and after flexure), the circuits could be attached to a structural material wherein the bonding agent or the structural material serves the function of a substrate within the system.

Although several examples and embodiments of flexible thermoelectric modules have been described above in various configurations, any flexible thermoelectric module and any variations of those embodiments described above are contemplated. Accordingly, the scope of the present invention is defined by the claims and not by any particular example. The examples above are meant to be illustrative and not in any way restrictive. In addition, the language of the claims is intended in its ordinary and accustomed meaning, without reference or special definition to any of the terms or limitation to the embodiments of those terms in the specification.

What is claimed is:

1. A flexible thermoelectric comprising:
   a plurality of thermoelectric elements; and
   first and second substrates, the substrates sandwiching the plurality of thermoelectric elements and having electrical conductors that interconnect ones of the plurality of thermoelectric elements, wherein at least one of the first and second substrates is constructed of a substantially rigid material, said substrates configured to flex in at least one direction.

2. The flexible thermoelectric of claim 1, wherein the at least one substrate constructed of the substantially rigid material is weakened in order to permit flexing of the thermoelectric.

3. The flexible thermoelectric of claim 1, wherein the at least one substrate constructed of the substantially rigid material has cuts in a plurality of locations in order to permit flexing of the thermoelectric.

4. The flexible thermoelectric of claim 3, wherein the thermoelectric is for use with a fluid flow, the cuts being formed in a manner to improve thermal isolation from section to section defined by the cuts in at least the direction of fluid flow.

5. The flexible thermoelectric of claim 1, wherein the at least one substrate constructed of the substantially rigid material is formed in sections in order to permit flexing of the thermoelectric.

6. The flexible thermoelectric of claim 5, wherein the thermoelectric is for use with a fluid flow, the sections configured to improve thermal isolation from section to section in at least the direction of fluid flow.

7. The flexible thermoelectric of claim 1, wherein the at least one substrate constructed of the substantially rigid material is shaped in a manner to permit flexing of the thermoelectric.

8. The flexible thermoelectric of claim 1, wherein at least portion of at least one of the first and second substrates is constructed of a material selected to permit flexing of the thermoelectric.

9. The flexible thermoelectric of claim 1, wherein thermoelectric flexes in at least two directions.

10. The flexible thermoelectric of claim 1, wherein the thermoelectric is constructed with a single layer of thermoelectric elements.

11. The flexible thermoelectric of claim 10, wherein the thermoelectric cools on a first side and heats on a second side, in response to an electrical current.

12. The flexible thermoelectric of claim 1, wherein at least a portion of the thermoelectric has multiple layers of thermoelectric elements.

13. The flexible thermoelectric of claim 12, wherein a first plurality of thermoelectric elements are positioned along a first side of a central substrate and a second plurality of thermoelectric elements are positioned along an opposing side of the central substrate, the first plurality of thermoelectric elements sandwiched between the first substrate and the central substrate, and the second plurality of thermoelectric elements sandwiched between said second substrate and the central substrate.

14. The flexible thermoelectric of claim 12, wherein the thermoelectric provides both heating and cooling on one side of the thermoelectric, in response to a current flow.

15. The flexible thermoelectric of claim 1, further comprising at least a first thermal conductor configured to provide heat flow to and/or from the thermoelectric.

16. The flexible thermoelectric of claim 1, further comprising at least a first thermal conductor that strengthens the thermoelectric.

17. A flexible thermoelectric comprising:
    a plurality of thermoelectric elements; and
    first and second substrates sandwiching the plurality of thermoelectric elements, wherein at least one of the first and second substrates comprises a substantially rigid material and is constructed in sections in a manner to permit flexing of the thermoelectric in at least one direction.

18. The flexible thermoelectric of claim 17, wherein at least one substrate is weakened in order to permit flexing.

19. The flexible thermoelectric of claim 18, wherein the at least one substrate constructed in sections has cuts in a plurality of locations to form said sections.

20. The flexible thermoelectric of claim 19, wherein the thermoelectric is for use with a fluid flow, the cuts being formed in a manner to improve thermal isolation from section to section in at least the direction of fluid flow.

21. The flexible thermoelectric of claim 18, wherein at least one substrate is shaped in a manner to permit flexing.

22. The flexible thermoelectric of claim 18, wherein at least a portion of at least one of the first and second substrates is constructed of a material selected to permit flexing of the thermoelectric.

23. The flexible thermoelectric of claim 18, wherein thermoelectric flexes in at least two directions.

24. The flexible thermoelectric of claim 18, wherein the thermoelectric is constructed with a single layer of thermoelectric elements.

25. The flexible thermoelectric of claim 24, wherein the thermoelectric cools on a first side and heats on a second side, in response to an electrical current.

26. The flexible thermoelectric of claim 18, wherein at least a portion of the thermoelectric has multiple layers of thermoelectric elements.

27. The flexible thermoelectric of claim 26, wherein a first plurality of thermoelectric elements are positioned along a first side of a central substrate and a second plurality of thermoelectric elements are positioned along an opposing side of the central substrate, the first plurality of thermoelectric elements sandwiched between the first substrate and the central substrate, and the second plurality of thermoelectric elements sandwiched between said second substrate and the central substrate.

28. The flexible thermoelectric of claim 27, wherein the thermoelectric provides both heating and cooling on one side of the thermoelectric, in response to a current flow.

29. The flexible thermoelectric of claim 18, further comprising at least a first thermal conductor configured to provide heat flow to and/or from the thermoelectric.

30. The flexible thermoelectric of claim 18, further comprising at least a first thermal conductor that strengthens the thermoelectric.

31. A flexible thermoelectric comprising:

a plurality of thermoelectric elements; and first and second substrates sandwiching the plurality of thermoelectric elements, wherein at least one of the first and second substrates comprises a substantially rigid material and is constructed in a non-uniform manner to permit flexing of the thermoelectric in at least one direction.

32. The flexible thermoelectric of claim 31, wherein at least one substrate is weakened in order to permit flexing.

33. The flexible thermoelectric of claim 31, wherein the at least one substrate constructed in a non-uniform manner has cuts in a plurality of locations to form sections.

34. The flexible thermoelectric of claim 33, wherein the thermoelectric is for use with a fluid flow, the cuts being formed in a manner to improve thermal isolation from section to section in at least the direction of fluid flow.

35. The flexible thermoelectric of claim 33, wherein at least one substrate is shaped in a manner to permit flexing.

36. The flexible thermoelectric of claim 31, wherein at least a portion of at least one of the first and second substrates is constructed of a material selected to permit flexing of the thermoelectric.

37. The flexible thermoelectric of claim 31, wherein thermoelectric flexes in at least two directions.

38. The flexible thermoelectric of claim 31, wherein the thermoelectric is constructed with a single layer of thermoelectric elements.

39. The flexible thermoelectric of claim 38, wherein the thermoelectric cools on a first side and heats on a second side, in response to an electrical current.

40. The flexible thermoelectric of claim 31, wherein at least a portion of the thermoelectric has multiple layers of thermoelectric elements.

41. The flexible thermoelectric of claim 40, wherein a first plurality of thermoelectric elements are positioned along a first side of a central substrate and a second plurality of thermoelectric elements are positioned along an opposing side of the central substrate, the first plurality of thermoelectric elements sandwiched between the first substrate and the central substrate, and the second plurality of thermoelectric elements sandwiched between said second substrate and the central substrate.

42. The flexible thermoelectric of claim 41, wherein the thermoelectric provides both heating and cooling on one side of the thermoelectric, in response to a current flow.

43. The flexible thermoelectric of claim 31, further comprising at least a first thermal conductor configured to provide heat flow to and/or from the thermoelectric.

44. The flexible thermoelectric of claim 31, further comprising at least a first thermal conductor that strengthens the thermoelectric.

45. A method of constructing a flexible thermoelectric, comprising the steps of:

providing a plurality of thermoelectric elements; and positioning the thermoelectric elements between first and second substrates, at least one of the substrates being constructed of a substantially rigid material, and configured to permit flexing of the thermoelectric.

46. The method of claim 45, further comprising the step of forming at least one of the substrates in sections to permit flexing.

47. The method of claim 45, further comprising the step of weakening at least one substrate in order to permit flexing.

48. The method of claim 45, further comprising the step of cutting at least one substrate in a plurality of locations in order to permit flexing.

49. The method of claim 48, wherein the thermoelectric is for use with a fluid flow, wherein the cuts are made in a manner to improve thermal isolation from section to section in at least the direction of fluid flow.

50. The method of claim 45, further comprising the step of shaping at least one substrate in a manner to permit flexing.

51. The method of claim 45, further comprising the step of forming at least a portion of at least one substrate of a material selected to permit flexing of the thermoelectric.

52. The method of claim 45, wherein the thermoelectric flexes in at least two directions.

53. The method of claim 45, wherein the step of positioning comprises forming a single layer of thermoelectric elements.

54. The method of claim 45, wherein the step of positioning comprises providing multiple layers of thermoelectric elements for at least a portion of the thermoelectric.

55. The method of claim 54, wherein a first plurality of thermoelectric elements are positioned along a first side of a central substrate and a second plurality of thermoelectric elements are positioned along an opposing side of the central substrate, the first plurality of thermoelectric elements sandwiched between the first substrate and the central substrate, and the second plurality of thermoelectric elements sandwiched between said second substrate and the central substrate.

56. The method of claim 55, wherein the thermoelectric provides both heating and cooling on one side of the thermoelectric, in response to a current flow.

57. The method of claim 56, further comprising the step of positioning at least a first thermal conductor that strengthens the thermoelectric.

* * * * *